United States Patent
Yeh

(10) Patent No.: US 9,177,656 B2
(45) Date of Patent: Nov. 3, 2015

(54) DATA WRITING METHOD, MEMORY STORAGE DEVICE AND MEMORY CONTROLLING CIRCUIT UNIT

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 49 days.

(21) Appl. No.: 14/162,783

(22) Filed: Jan. 24, 2014

(65) Prior Publication Data

US 2015/0131386 A1    May 14, 2015

(30) Foreign Application Priority Data

Nov. 12, 2013   (TW) .............................. 102141080 U

(51) Int. Cl.
- G11C 11/34 (2006.01)
- G11C 16/04 (2006.01)
- G11C 16/14 (2006.01)
- G11C 16/10 (2006.01)

(52) U.S. Cl.
   CPC ............... *G11C 16/14* (2013.01); *G11C 16/10* (2013.01)

(58) Field of Classification Search
   CPC .......... G11C 5/141; G11C 5/143; G11C 5/14; G11C 5/04; G11C 5/147; G11C 16/12; G11C 5/148; G11C 7/24; G11C 11/4074; G11C 14/0036; G11C 14/0081
   See application file for complete search history.

(56) References Cited

U.S. PATENT DOCUMENTS

| 8,589,619 B2 * | 11/2013 | Yeh ............................... 711/103 |
| 8,892,814 B2 * | 11/2014 | Yeh ............................... 711/103 |
| 9,058,256 B2 * | 6/2015 | Yeh ....................................... 1/1 |
| 2010/0208504 A1 * | 8/2010 | Kim et al. ...................... 365/80 |

* cited by examiner

*Primary Examiner* — Hien Nguyen
(74) *Attorney, Agent, or Firm* — Jianq Chyun IP Office

(57) ABSTRACT

The writing method includes: grouping logical erasing units into a first region and an second region; determining if a first logical erasing unit which a host system intends to write belongs to the first region or the second region; if the first logical erasing unit belongs to the first region, writing data to a spare physical programming unit, wherein the physical erasing unit to which the spare physical programming belongs further stores data belonging to another logical erasing unit; if the first logical erasing unit belongs to the second region, writing data to a physical erasing unit in which all the valid data belong to the first logical erasing unit. Accordingly, a speed of sequential writing is guaranteed to be greater than a target value.

21 Claims, 11 Drawing Sheets

DATA WRITING METHOD, MEMORY STORAGE DEVICE AND MEMORY CONTROLLING CIRCUIT UNIT

CROSS-REFERENCE TO RELATED APPLICATION

This application claims the priority benefit of Taiwan application serial no. 102141080, filed on Nov. 12, 2013. The entirety of the above-mentioned patent application is hereby incorporated by reference herein and made a part of this specification.

BACKGROUND

1. Technology Field

The invention relates to a data writing mechanism, and particularly relates to a data writing method, a memory storage device, and a memory controlling circuit unit for a rewritable non-volatile memory module.

2. Description of Related Art

The market of digital cameras, mobile phones, and MP3 players has expanded rapidly in recent years, resulting in consumers' escalated demand for storage media. The characteristics of data non-volatility, low power consumption, compact size, and no mechanical structure make the rewritable non-volatile memory module (e.g. flash memory) ideal for being built in the portable multi-media devices as cited above.

Generally speaking, the rewritable non-volatile memory module is used in combination with a host system. A volatile memory may be further disposed in the host system for storing some data of the host system during operation. If the host system is powered down suddenly or enters a sleep mode, the data in the volatile memory needs to be written to the rewritable non-volatile memory module. In some situations, the data in the volatile memory is sequentially dumped to the rewritable non-volatile memory module and the host system has to complete all writing within a preset time. Therefore, the rewritable non-volatile memory module also needs to complete a large number of sequential writing operations within the preset time. In other words, the speed of sequential writing needs to be higher than a target value.

With different managements of the rewritable non-volatile memory module, there is a trade-off between sequential writing and non-sequential writing. In general, management of the rewritable non-volatile memory module based on logical programming units achieves higher speed in non-sequential writing. On the other hand, if the management is based on logical erasing units, higher sequential writing speed is achieved. In normal operations, the host system executes non-sequential writing more frequently than sequential writing. However, a large number of sequential writing operations may be required in the case of a sudden power down or sleep mode. In the case of managing the rewritable non-volatile memory module based on the logical programming units, if sequential writing is performed after performing non-sequential writing for a period of time, the speed of sequential writing may drop significantly due to garbage collection, thus causing that a large number of sequential writing operations cannot be completed within the preset time. Therefore, how to ensure that the sequential writing speed is higher than the target value in the above cases is a concern of persons skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a data writing method, a memory storage device, and a memory controlling circuit unit, which ensure that a sequential writing speed is higher than a target value.

According to an exemplary embodiment of the invention, a data writing method is adapted for a rewritable non-volatile memory module. The rewritable non-volatile memory module includes a plurality of physical erasing units each including a plurality of physical programming units. The data writing method includes: configuring a plurality of logical addresses, wherein the logical addresses constitute a plurality of logical programming units and the logical programming units constitute a plurality of logical erasing units; grouping the logical erasing units into a first region and a second region; receiving a write command from a host system, wherein the write command instructs to write first data to at least one first logical address and the first logical address belongs to a first logical erasing unit; determining whether the first logical erasing unit belongs to the first region or the second region; executing a first writing procedure if the first logical erasing unit belongs to the first region; and executing a second writing procedure if the first logical erasing unit belongs to the second region. The first writing procedure includes: selecting a spare physical programming unit; and writing the first data to the spare physical programming unit. The spare physical programming unit belongs to a first physical erasing unit and the first physical erasing unit further stores data belonging to a second logical erasing unit, and the second logical erasing unit is different from the first logical erasing unit. The second writing procedure includes: selecting a second physical erasing unit; and writing the first data to the second physical erasing unit. All valid data in the second physical erasing unit belongs to the first logical erasing unit.

An exemplary embodiment of the invention provides a memory storage device including a connection interface unit, the rewritable non-volatile memory module, and a memory controlling circuit unit. The connection interface unit is coupled to the host system. The memory controlling circuit unit is coupled to the connection interface unit and the rewritable non-volatile memory module and configured to configure the logical addresses. The memory controlling circuit unit is configured to group the logical erasing units to a first region and a second region and receive a write command from the host system, wherein the write command instructs to write first data to at least one first logical address and the first logical address belongs to a first logical erasing unit. The memory controlling circuit unit is also configured to determine whether the first logical erasing unit belongs to the first region or the second region. If the first logical erasing unit belongs to the first region, the memory controlling circuit unit is configured to select a spare physical programming unit and write the first data to the spare physical programming unit. The spare physical programming unit belongs to a first physical erasing unit and the first physical erasing unit further stores data belonging to a second logical erasing unit, and the second logical erasing unit is different from the first logical erasing unit. If the first logical erasing unit belongs to the second region, the memory controlling circuit unit is configured to select a second physical erasing unit and write the first data to the second physical erasing unit, wherein all valid data in the second physical erasing unit belongs to the first logical erasing unit.

An exemplary embodiment of the invention provides a memory controlling circuit unit adapted for controlling the rewritable non-volatile memory module. The memory controlling circuit unit includes a host interface, a memory interface, and a memory management circuit. The host interface is coupled to a host system. The memory interface is coupled to the rewritable non-volatile memory module. The memory management circuit is coupled to the host interface and the memory interface and configured to configure the logical addresses. The memory management circuit is configured to group the logical erasing units to a first region and a second region and receive a write command from the host system, wherein the write command instructs to write first data to at least one first logical address and the first logical address belongs to a first logical erasing unit. The memory management circuit is also configured to determine whether the first logical erasing unit belongs to the first region or the second region. If the first logical erasing unit belongs to the first region, the memory management circuit is configured to select a spare physical programming unit and write the first data to the spare physical programming unit. The spare physical programming unit belongs to a first physical erasing unit and the first physical erasing unit further stores data belonging to a second logical erasing unit, and the second logical erasing unit is different from the first logical erasing unit. If the first logical erasing unit belongs to the second region, the memory management circuit is configured to select a second physical erasing unit and write the first data to the second physical erasing unit, wherein all valid data in the second physical erasing unit belongs to the first logical erasing unit.

Based on the above, the data writing method, memory storage device, and memory controlling circuit unit disclosed in the exemplary embodiments of the invention are capable of grouping the logical erasing units into the second region and the first region, such that the sequential writing speed is higher than the target writing speed in any condition.

To make the aforementioned and other features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
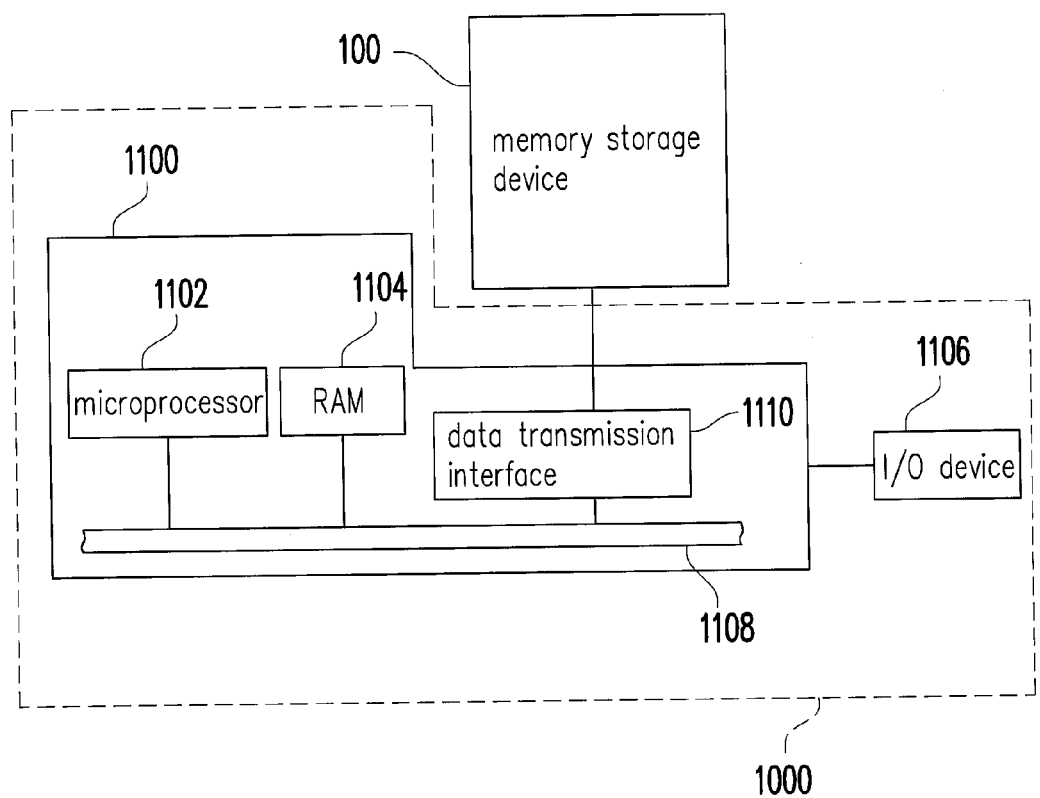
FIG. 1A illustrates a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (i.e. a memory storage system) includes a rewritable non-volatile memory module and a controller (i.e. a controlling circuit). The memory storage device is usually used together with a host system for the host system to write data to or read data from the memory storage device.

FIG. 1A illustrates the host system and the memory storage device according to an exemplary embodiment of the invention.

Figure 1B:
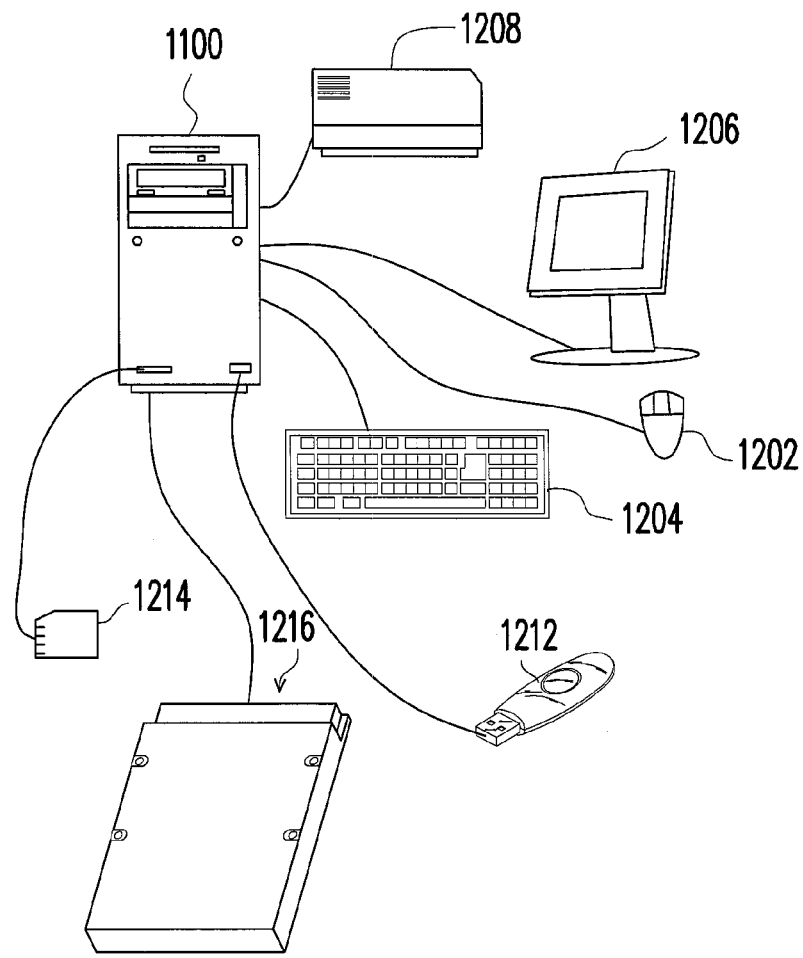
FIG. 1B is a schematic diagram of a computer, an input/output device, and a memory storage device according to an exemplary embodiment of the invention.

Referring to FIG. 1A, generally a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 1B. It should be understood that the devices illustrated in FIG. 1B are not intended to limit the I/O device 1106, and the I/O device 1106 may further include other devices.

According to an exemplary embodiment of the invention, the memory storage device 100 is coupled to other elements of the host system 1000 through the data transmission interface 1110. Through operations of the microprocessor 1102, the random access memory 1104 and the I/O device 1106, data is written to or read from the memory storage device 100.

For instance, the memory storage device 100 may be a rewritable non-volatile memory storage device, such as a flash drive 1212, a memory card 1214, or a solid state drive (SSD) 1216, as shown in FIG. 1B.

Figure 1C:
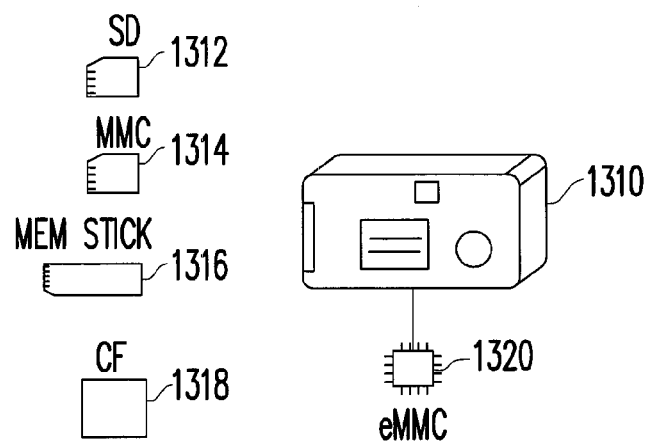
FIG. 1C is a schematic diagram of a host system and a memory storage device according to an exemplary embodiment of the invention.

Generally speaking, the host system 1000 can substantially be any system collocated with the memory storage device 100 for storing data. Even though the host system 1000 is described as a computer system in this exemplary embodiment, in another exemplary embodiment of the invention, the host system 1000 may be a digital camera, a video camera, a telecommunication device, an audio player, or a video player. For example, if the host system is a digital camera (video camera) 1310, the rewritable non-volatile memory storage device is then a secure digital (SD) card 1312, a multi media card (MMC) 1314, a memory stick 1316, a compact flash (CF) card 1318, or an embedded storage device 1320 (as shown in FIG. 1C). The embedded storage device 1320 includes an embedded MMC (eMMC). It should be mentioned that the eMMC is directly coupled to a substrate of the host system.

Figure 2:
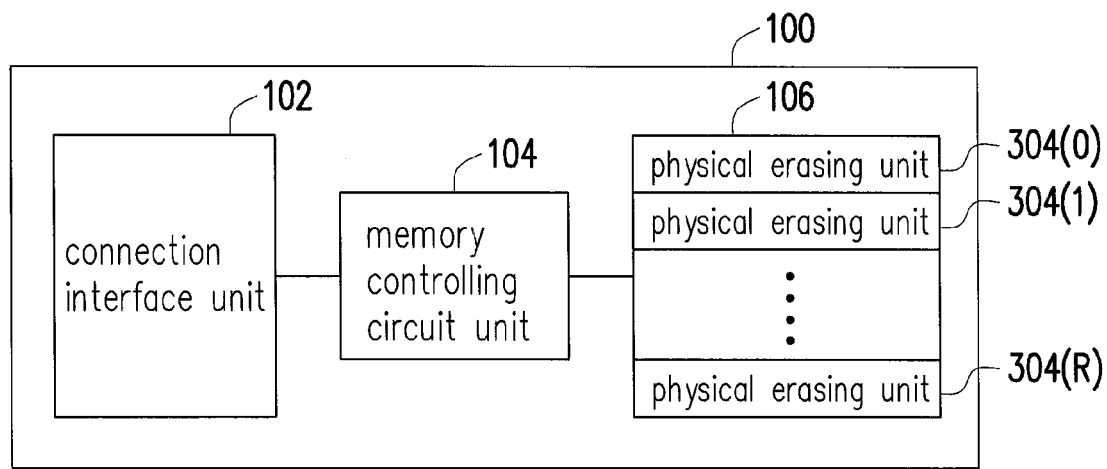
FIG. 2 is a schematic block diagram of the memory storage device illustrated in FIG. 1A.

FIG. 2 is a schematic block diagram of the memory storage device illustrated in FIG. 1A.

Referring to FIG. 2, the memory storage device 100 includes a connection interface unit 102, a memory controlling circuit unit 104, and a rewritable non-volatile memory module 106.

In this exemplary embodiment, the connection interface unit 102 is compatible to the Serial Advanced Technology Attachment (SATA) standard. However, it should be noted that the invention is not limited thereto, and the connection interface unit 102 may also comply with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the Secure Digital (SD) interface standard, the Ultra High Speed-I (UHS-I) interface standard, the Ultra High Speed-II (UHS-II) interface standard, the Memory Stick (MS) interface standard, the Multi Media Card (MMC) interface standard, the Embedded Multimedia Card (eMMC) interface standard, the Universal Flash Storage (UFS) interface standard, the Compact Flash (CF) interface standard, the Integrated Device Electronics (IDE) interface standard, or other suitable standards. The connection interface unit 102 may be packaged in a chip together with the memory controlling circuit unit 104, or the connection interface unit 102 may be disposed outside a chip including the memory controlling circuit unit 104.

The memory controlling circuit unit 104 is configured for executing a plurality of logic gates or control commands implemented in a hardware form or in a firmware form, and performing various operations, such as data writing, data reading, or data erasing, in the rewritable non-volatile memory module 106 according to a command of the host system 1000.

The rewritable non-volatile memory module 106 is coupled to the memory controlling circuit unit 104 for storing data written by the host system 1000. The rewritable non-volatile memory module 106 includes physical erasing units 304(0)-304(R). For example, the physical erasing units 304(0)-304(R) may belong to the same or different memory dies. Each of the physical erasing units includes a plurality of physical programming units, and the physical programming units belonging to the same physical erasing unit may be written independently or erased simultaneously. For example, each physical erasing unit is composed of 128 physical programming units. However, it should be noted that the invention is not limited thereto. Each physical erasing unit may be composed of 64 or 256 physical programming units or any other number.

More specifically, each physical erasing unit includes a plurality of word lines and a plurality of bit lines, wherein a memory cell is disposed at an intersection of each word line and each bit line. Each memory cell is configured for storing one or a plurality of bits. In the same physical erasing unit, all the memory cells are erased simultaneously. In this exemplary embodiment, each physical erasing unit is the smallest erasing unit. That is to say, each of the physical erasing units has a minimum number of memory cells for being erased together. The physical erasing unit is a physical block, for example. In addition, the memory cells on the same word line form one or a plurality of physical programming units. If each memory cell stores two bits or more, the physical programming units on the same word line may be categorized as a lower physical programming unit and an upper physical programming unit. Generally speaking, a writing speed of the lower physical programming unit is higher than a writing speed of an upper physical programming unit. In this exemplary embodiment, each physical programming unit is the smallest programming unit. In other words, each physical programming unit is the smallest unit for writing data. For example, the physical programming unit is a physical page or a physical sector. If the physical programming unit is one physical page, each of the physical programming units usually includes a data bit region and a redundant bit region. The data bit region includes a plurality of physical sectors for storing user data, and the redundant bit region is configured for storing system data (e.g. an error correcting code). In this exemplary embodiment, each data bit region includes 32 physical sectors, and each physical sector is 512 bytes (B). However, in other exemplary embodiments, the data bit region may include 8, 16, or more or fewer physical sectors. The invention is not intended to limit the size and number of the physical sectors.

In this exemplary embodiment, the rewritable non-volatile memory module 106 is a Multi Level Cell (MLC) NAND flash memory module. That is, each memory cell stores at least two bits. However, the invention is not limited thereto. The rewritable non-volatile memory module 106 may be a Single Level Cell (SLC) NAND flash memory module, a Trinary Level Cell (TLC) NAND flash memory module, other flash memory modules, or memory modules having the same characteristics.

Figure 3:
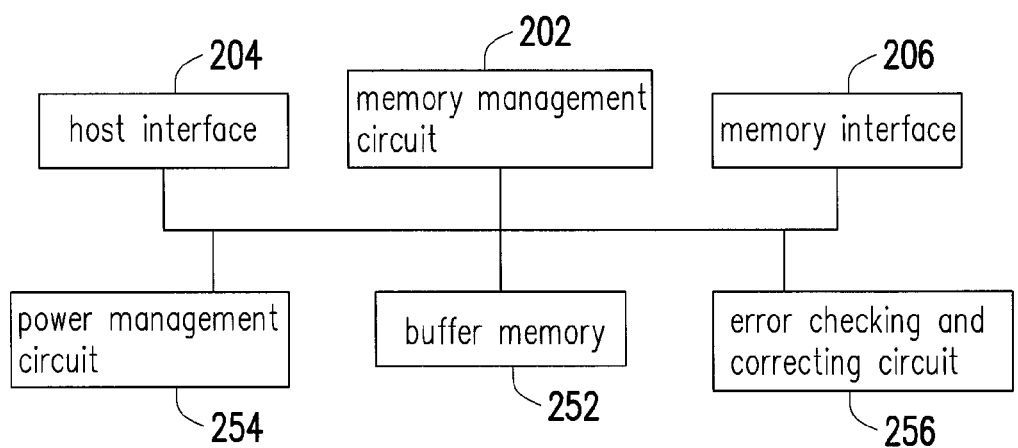
FIG. 3 is a schematic block diagram of a memory controlling circuit unit according to an exemplary embodiment of the invention.

FIG. 3 is a schematic block diagram of a memory controlling circuit unit according to an exemplary embodiment of the invention.

Referring to FIG. 3, the memory controlling circuit unit 104 includes a memory management circuit 202, a host interface 204, and a memory interface 206.

The memory management circuit 202 is configured for controlling an overall operation of the memory controlling circuit unit 104. More specifically, the memory management circuit 202 has a plurality of control commands. When the memory storage device 100 is operated, the control commands are executed to perform various data operations such as data writing, data reading, and data erasing. The following description of the operation of the memory management circuit 202 is equivalent to the description of the operation of the memory controlling circuit unit 104, which will not be repeated hereinafter.

In this exemplary embodiment, the control commands of the memory management circuit 202 are implemented in a firmware form. For instance, the memory management circuit 202 has a microprocessor unit (not shown) and a read-only memory (not shown), and the control commands are burnt into the read-only memory. When the memory storage device 100 is operated, the control commands are executed by the microprocessor unit for performing various data operations, such as data writing, data reading, and data erasing.

According to another exemplary embodiment of the invention, the control commands of the memory management circuit 202 may also be stored in a specific region (for example, the system region in the memory module exclusively used for storing system data) of the rewritable non-volatile memory module 106 as program codes. Moreover, the memory management circuit 202 has a microprocessor unit (not shown), a read-only memory (not shown), and a random access memory (not shown). In particular, the read-only memory has a boot code. When the memory controlling circuit unit 104 is enabled, the boot code is first executed by the microprocessor unit for loading the control commands stored in the rewritable non-volatile memory module 106 into the random access memory of the memory management circuit 202. Afterwards, the microprocessor unit executes the control commands for various data operations such as data writing, data reading, and data erasing.

Additionally, according to another exemplary embodiment of the invention, the control commands of the memory management circuit 202 may be implemented in a hardware form. For example, the memory management circuit 202 includes a microcontroller, a memory management unit, a memory writing unit, a memory reading unit, a memory erasing unit, and a data processing unit. The memory management unit, the memory writing unit, the memory reading unit, the memory erasing unit, and the data processing unit are coupled to the microcontroller. The memory management unit is configured for managing the physical erasing units of the rewritable non-volatile memory module 106; the memory writing unit is configured for issuing a write command to the rewritable non-volatile memory module 106 in order to write data to the rewritable non-volatile memory module 106; the memory reading unit is configured for issuing a read command to the rewritable non-volatile memory module 106 in order to read data from the rewritable non-volatile memory module 106; the memory erasing unit is configured for issuing an erase command to the rewritable non-volatile memory module 106 in order to erase data from the rewritable non-volatile memory module 106; and the data processing unit is configured for processing both the data to be written to the rewritable non-volatile memory module 106 and the data to be read from the rewritable non-volatile memory module 106.

The host interface 204 is coupled to the memory management circuit 202 and configured for receiving and identifying commands and data transmitted from the host system 1000. In other words, the commands and data sent by the host system 1000 are passed to the memory management circuit 202 through the host interface 204. In this exemplary embodiment, the host interface 204 is compatible to the SATA standard. However, it should be understood that the invention is not limited thereto, and the host interface 204 may also be compatible to a PATA standard, an IEEE 1394 standard, a PCI Express standard, a USB standard, a SD standard, a UHS-I standard, a UHS-II standard, a MS standard, a MMC standard, an eMMC standard, a UFS standard, a CF standard, an IDE standard, or other suitable standards for data transmission.

The memory interface 206 is coupled to the memory management circuit 202 for accessing the rewritable non-volatile memory module 106. In other words, data desired to be written to the rewritable non-volatile memory module 106 is converted to an acceptable format to the rewritable non-volatile memory module 106 by the memory interface 206.

In an exemplary embodiment of the invention, the memory controlling circuit unit 104 further includes a buffer memory 252, a power management circuit 254, and an error checking and correcting (ECC) circuit 256.

The buffer memory 252 is coupled to the memory management circuit 202 and configured for temporarily storing data and commands from the host system 1000 or data from the rewritable non-volatile memory module 106.

The power management circuit 254 is coupled to the memory management circuit 202 and configured for controlling the power of the memory storage device 100.

The error checking and correcting circuit 256 is coupled to the memory management circuit 202 and configured for executing an error checking and correcting procedure to ensure the correctness of data. To be more specific, when the memory management circuit 202 receives a write command from the host system 1000, the error checking and correcting circuit 256 generates an error correcting code (ECC) for the data corresponding to the write command, and the memory management circuit 202 writes the data corresponding to the write command and the corresponding ECC to the rewritable non-volatile memory module 106. Subsequently, when the memory management circuit 202 reads the data from the rewritable non-volatile memory module 106, the corresponding ECC is also read by the rewritable non-volatile memory module 106, and the error checking and correcting circuit 256 executes the error checking and correcting procedure for the read data based on the ECC.

Figure 4:
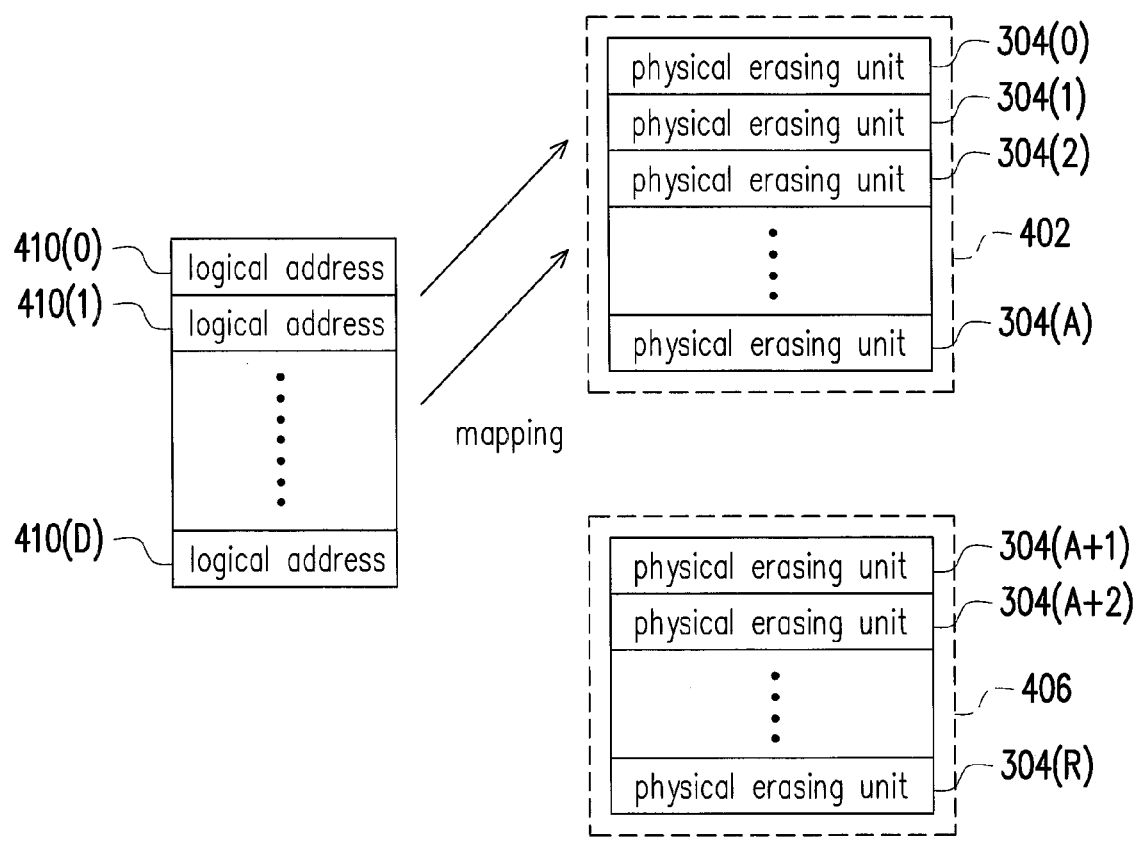
FIG. 4 is a schematic diagram illustrating management of a rewritable non-volatile memory module according to an exemplary embodiment of the invention.

FIG. 4 is a schematic diagram illustrating management of a rewritable non-volatile memory module according to an exemplary embodiment of the invention.

It should be understood that terms, such as "select," "divide," "associate," and so forth, are logical concepts which describe operations on the physical erasing units of the rewritable non-volatile memory module 106. That is, the physical erasing units of the rewritable non-volatile memory module 106 are logically operated, but the actual positions of the physical erasing units are not changed.

Referring to FIG. 4, the memory management circuit 202 logically groups the physical erasing units 304(0)-304(R) of the rewritable non-volatile memory module 106 into a plurality of regions, such as a storage region 402 and a system region 406.

The physical erasing units of the storage region 402 are used for storing the data from the host system 1000. The storage region 402 stores valid data and invalid data. For example, when the host system 1000 deletes valid data, the deleted data may still be stored in the storage region 402 but marked as invalid data. One physical erasing unit that does not store any valid data therein is also called a spare physical erasing unit, and one physical programming unit that does not store any valid data is also called a spare physical programming unit. For example, the physical erasing unit that has been erased becomes one spare physical erasing unit. If any physical erasing unit in the storage region 402 or the system region 406 is damaged, the physical erasing units in the storage region 402 may be used to replace the damaged physical erasing unit. If there is no available physical erasing unit in the storage region 402 for replacing the damaged physical erasing unit, the memory management circuit 202 announces the entire memory storage device 100 as being in a write protect state and data cannot be written therein.

The physical erasing units in the system region 406 are used for recording the system data, which includes information related to the manufacturer and model number of a memory chip, the number of the physical erasing units in the memory chip, the number of the physical programming units of each physical erasing unit, and so forth.

The numbers of the physical erasing units of the storage region 402 and the system region 406 may vary according to different memory specifications. In addition, it should be understood that, during the operation of the memory storage device 100, the grouping of the physical erasing units to the storage region 402 and the system region 406 varies dynamically. For instance, when a physical erasing unit in the system region 406 is damaged and replaced by a physical erasing unit in the storage region 402, the physical erasing unit that is originally grouped to the storage region 402 is associated to the system region 406.

The memory management circuit 202 allocates logical addresses 410(0)-410(D) to be mapped to partial physical erasing units 304(0)-304(A) in the storage region 402. The host system 1000 accesses data in the storage region 402 through the logical addresses 410(0)-410(D). In this exemplary embodiment, one logical address is mapped to one physical sector. A plurality of logical addresses constitute a logical programming unit, and a plurality of logical programming units constitute a logical erasing unit. One logical programming unit is mapped to one or multiple physical programming units, and one logical erasing unit is mapped to one or multiple physical erasing units.

The memory management circuit 202 may manage the rewritable non-volatile memory module 106 by the logical erasing units or the logical programming units. According to this exemplary embodiment, the memory management circuit 202 groups all the logical erasing units into a first region and a second region. In the first region, the memory management circuit 202 manages the corresponding physical erasing units by the logical programming units; and in the second region, the memory management circuit 202 manages the corresponding physical erasing units by the logical erasing units. To be more specific, assume that the memory management circuit 202 receives a write command from the host system 1000, and this write command instructs to write first data to at least one first logical address of the logical addresses 410(0)-410(D). The memory management circuit 202 determines whether the logical erasing unit (i.e. a first logical erasing unit), to which the first logical address belongs, belongs to the first region or the second region. If the first logical erasing unit belongs to the first region, the memory management circuit 202 executes a first writing procedure to write the first data. If the first logical erasing unit belongs to the second region, the memory management circuit 202 executes a second writing procedure to write the first data. Another exemplary embodiment is given below to illustrate the first writing procedure and the second writing procedure.

FIG. 5A to FIG. 5D are schematic diagrams illustrating the first writing procedure according to an exemplary embodiment of the invention.

Figure 5A:
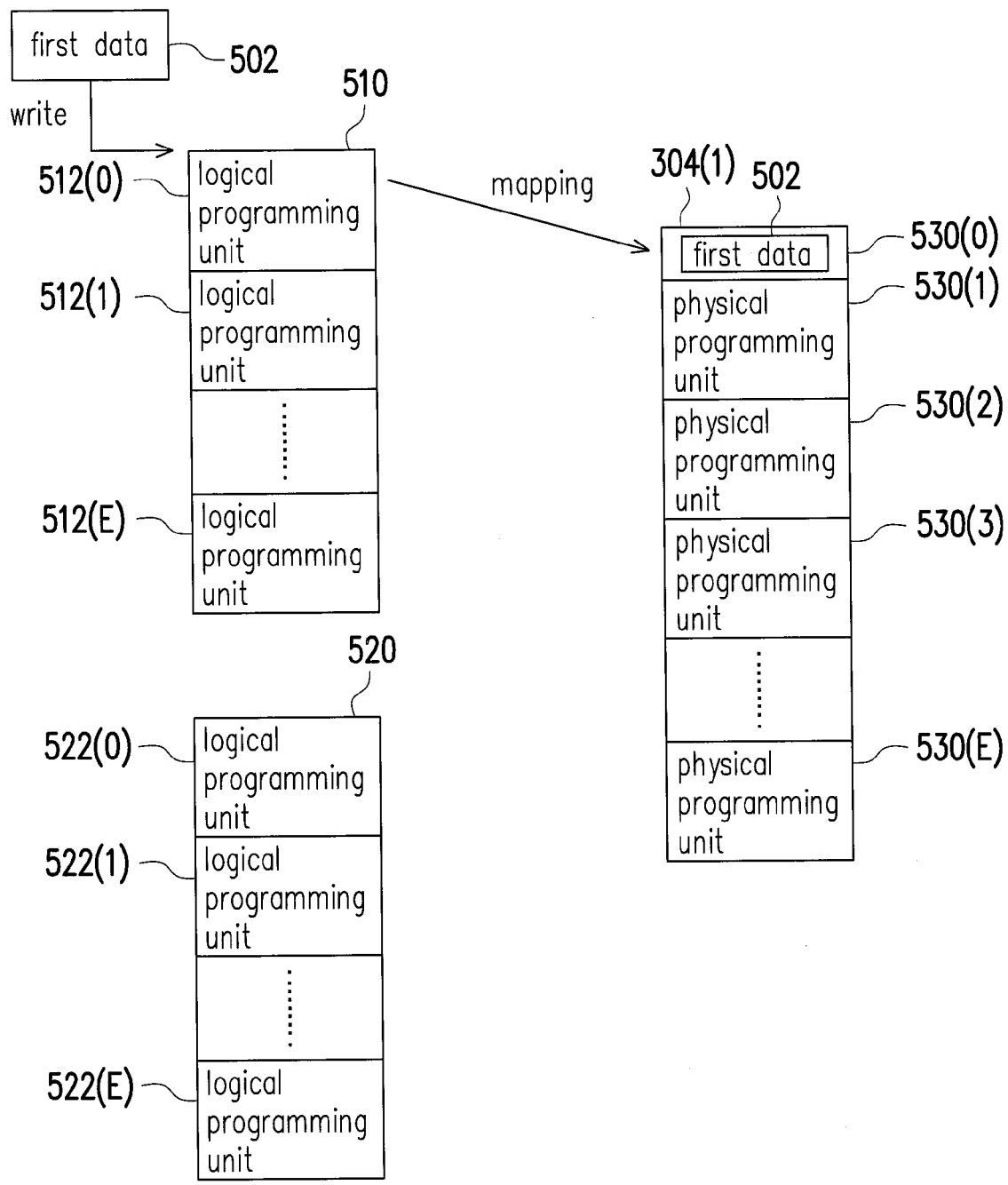
FIG. 5A to FIG. 5D are schematic diagrams illustrating a first writing procedure according to an exemplary embodiment of the invention.

With reference to FIG. 5A, it is provided that a logical erasing unit 510 belongs to the first region, the write command issued by the host system 1000 instructs to write first data 502 to a logical programming unit 512(0) in the logical erasing unit 510, and the physical erasing unit 304(1) includes spare physical programming units 530(0)-530(E). After receiving the write command, the memory management circuit 202 determines whether the logical erasing unit 510 belongs to the first region or the second region. After determining that the logical erasing unit 510 belongs to the first region, the memory management circuit 202 selects one spare physical programming unit 530(0) and writes the first data 502 to the spare physical programming unit 530(0), and then maps the logical programming unit 512(0) to the physical programming unit 530(0).

Figure 5B:
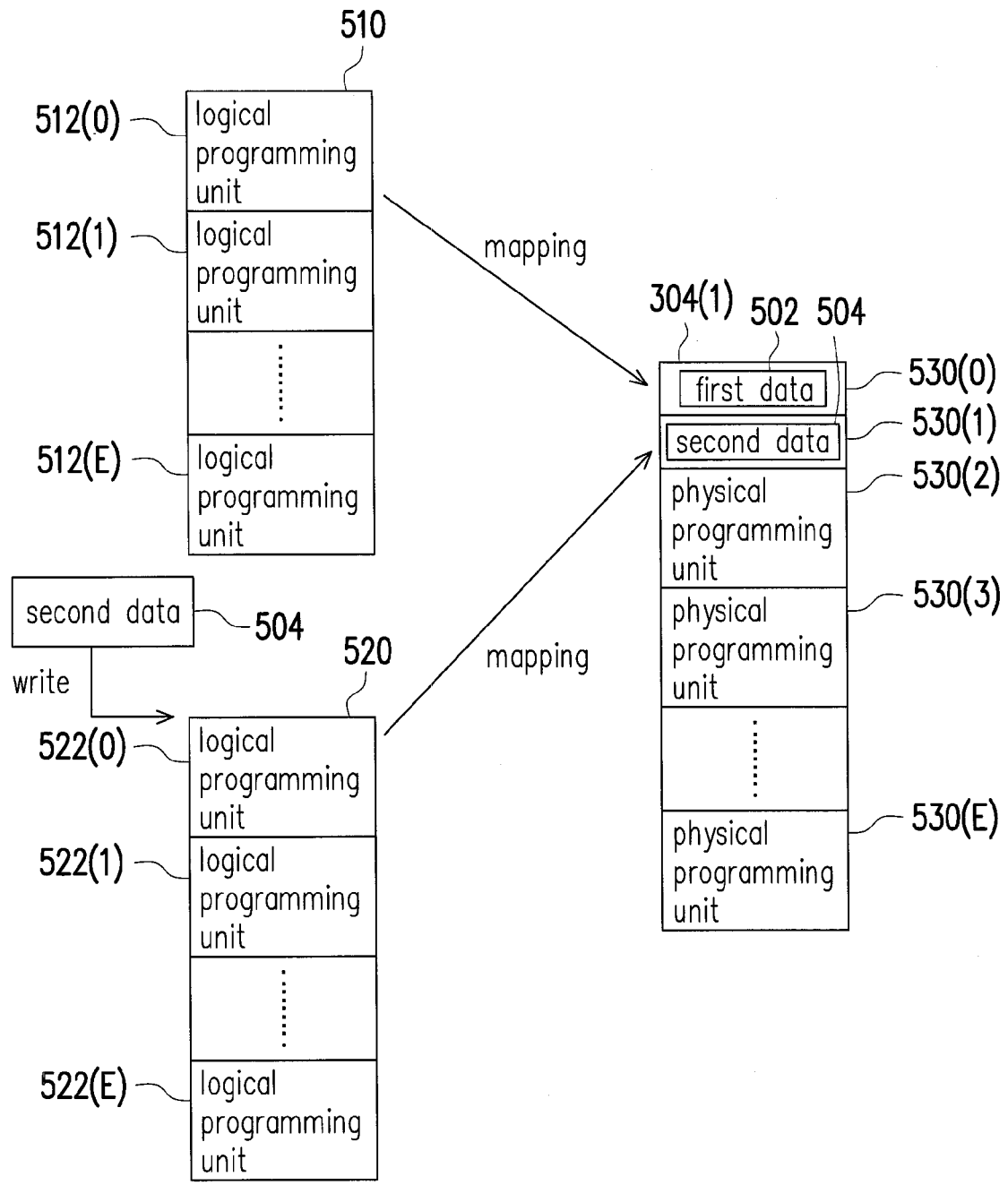

Referring to FIG. 5B, next, the host system 1000 issues another write command which instructs to write second data 504 to a logical programming unit 522(0) in a logical erasing unit 520, wherein the logical erasing unit 520 also belongs to the first region. The memory management circuit 202 selects the spare physical programming unit 530(1) and writes the second data 504 to the physical programming unit 530(1), and then maps the logical programming unit 522(0) to the physical programming unit 530(1).

Figure 5C:
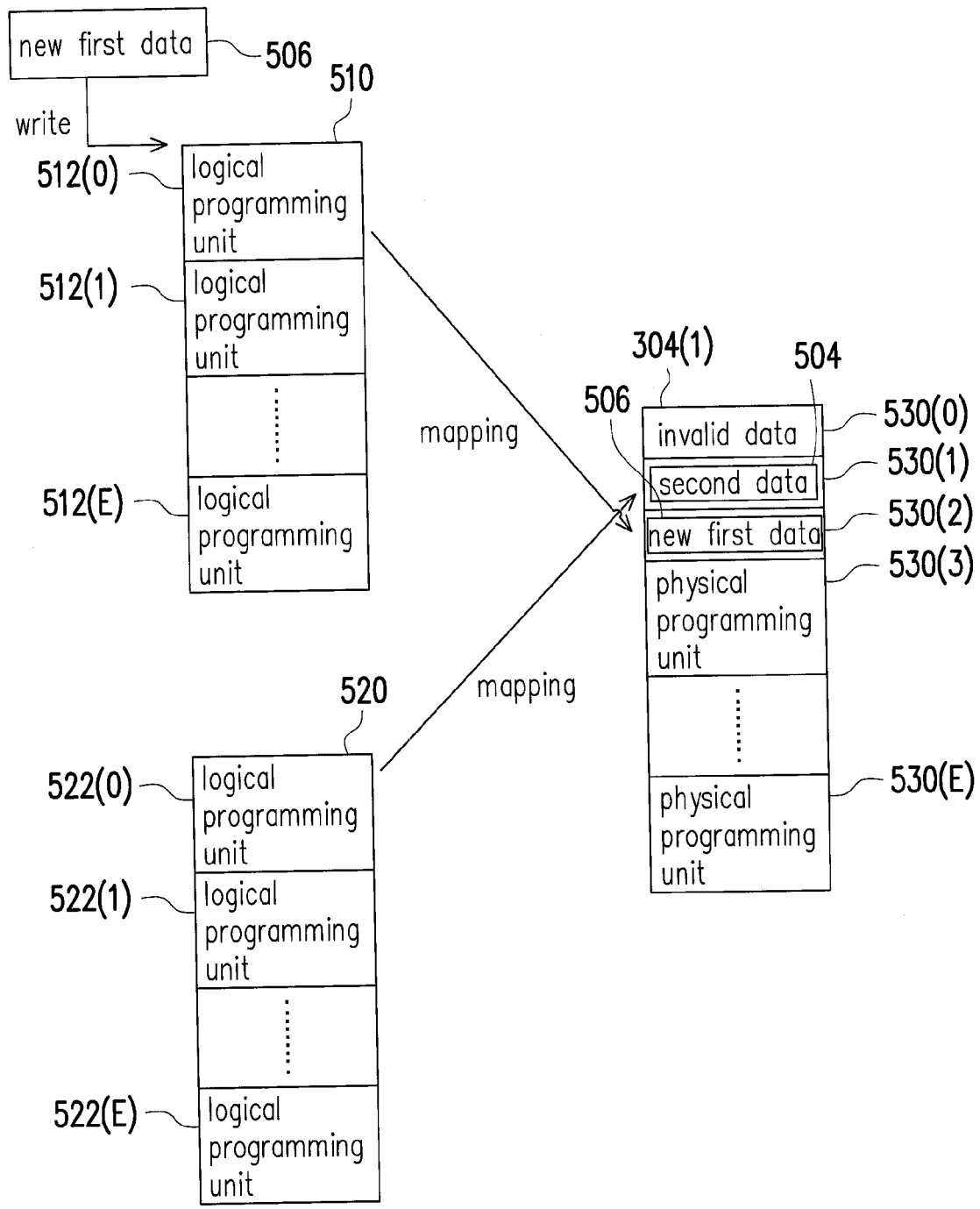

Referring to FIG. 5C, then, if the host system 1000 intends to renew the first data 502, the host system 1000 further issues a write command to write new first data 506 to the logical programming unit 512(0). The memory management circuit 202 writes the new first data 506 to the spare physical programming unit 530(2) and maps the logical programming unit 512(0) to the physical programming unit 530(2). At this time, the physical programming unit 530(0) stores invalid data belonging to the logical erasing unit 510.

Figure 5D:
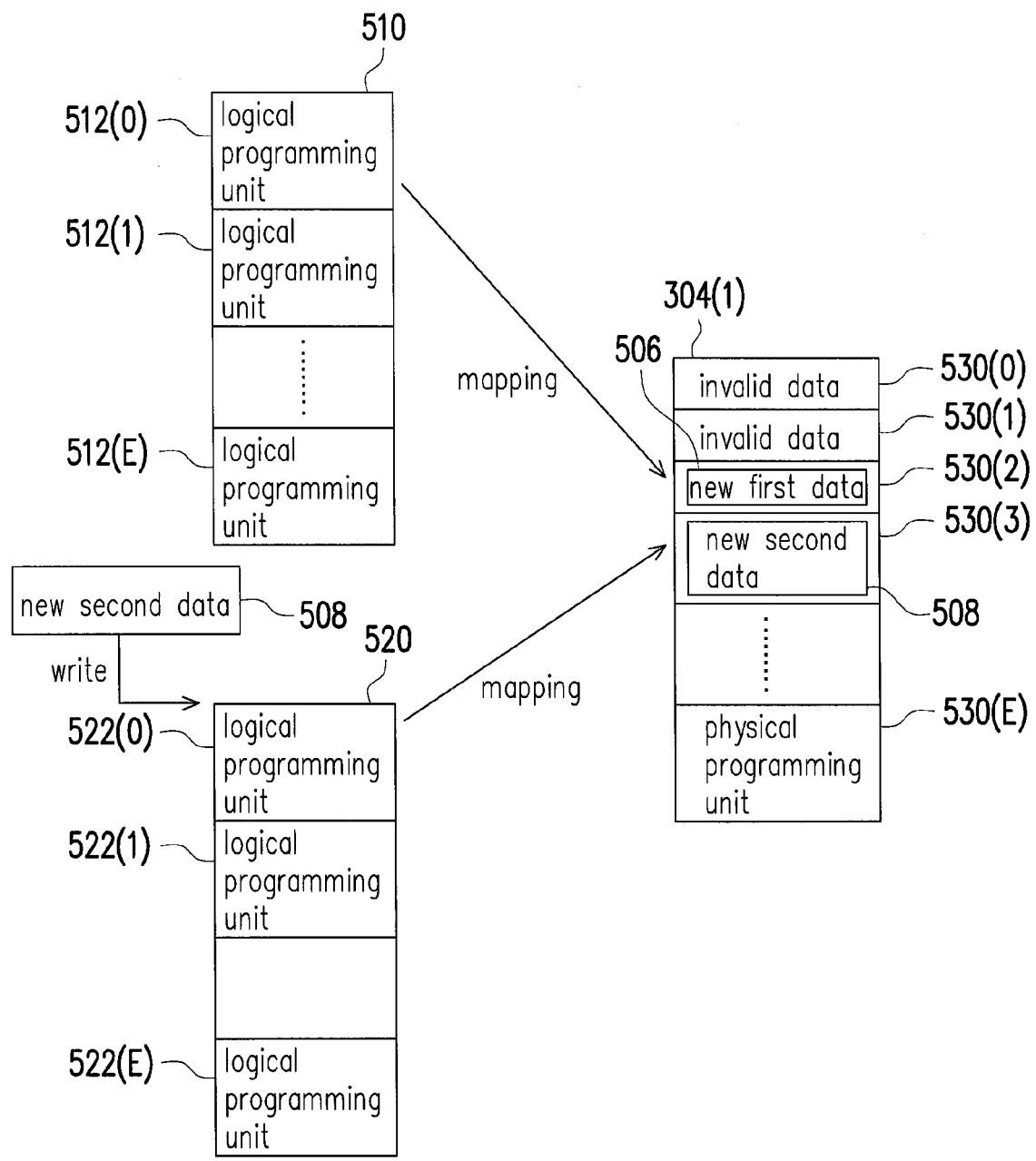

Referring to FIG. 5D, if the host system 1000 intends to renew the second data 504 following the above, the host system 1000 further issues a write command to write new second data 508 to the logical programming unit 522(0). The memory management circuit 202 then writes the new second data 508 to the spare physical programming unit 530(3) and maps the logical programming unit 522(0) to the physical programming unit 530(3). At this time, the physical programming unit 530(1) stores invalid data belonging to the logical erasing unit 520. In other words, the physical erasing unit 304(1) (i.e. the first physical erasing unit) not only stores data (can be valid data or invalid data) belonging to the logical erasing unit 510 (i.e. the first logical erasing unit) but also stores data (can be valid data or invalid data) belonging to the logical erasing unit 520 (i.e. the second logical erasing unit), and the logical erasing unit 510 is different from the logical erasing unit 520.

In this exemplary embodiment, when receiving the write command, the memory management circuit 202 first uses spare physical programming units in the physical erasing unit 304(1) for writing data. If there is no spare physical programming unit in the physical erasing unit 304(1), the memory management circuit 202 further selects one spare physical erasing unit from the storage region 402 for writing data.

It should be noted that the embodiment illustrated in FIG. 5A to FIG. 5D is simply an example, and the invention is not intended to limit an order of writing the first data 520 and the second data 504. Alternatively, before writing the first data 502, the physical erasing unit 304(1) may also store valid data or invalid data that belongs to other logical erasing units (different from the logical erasing unit 510).

Figure 6:
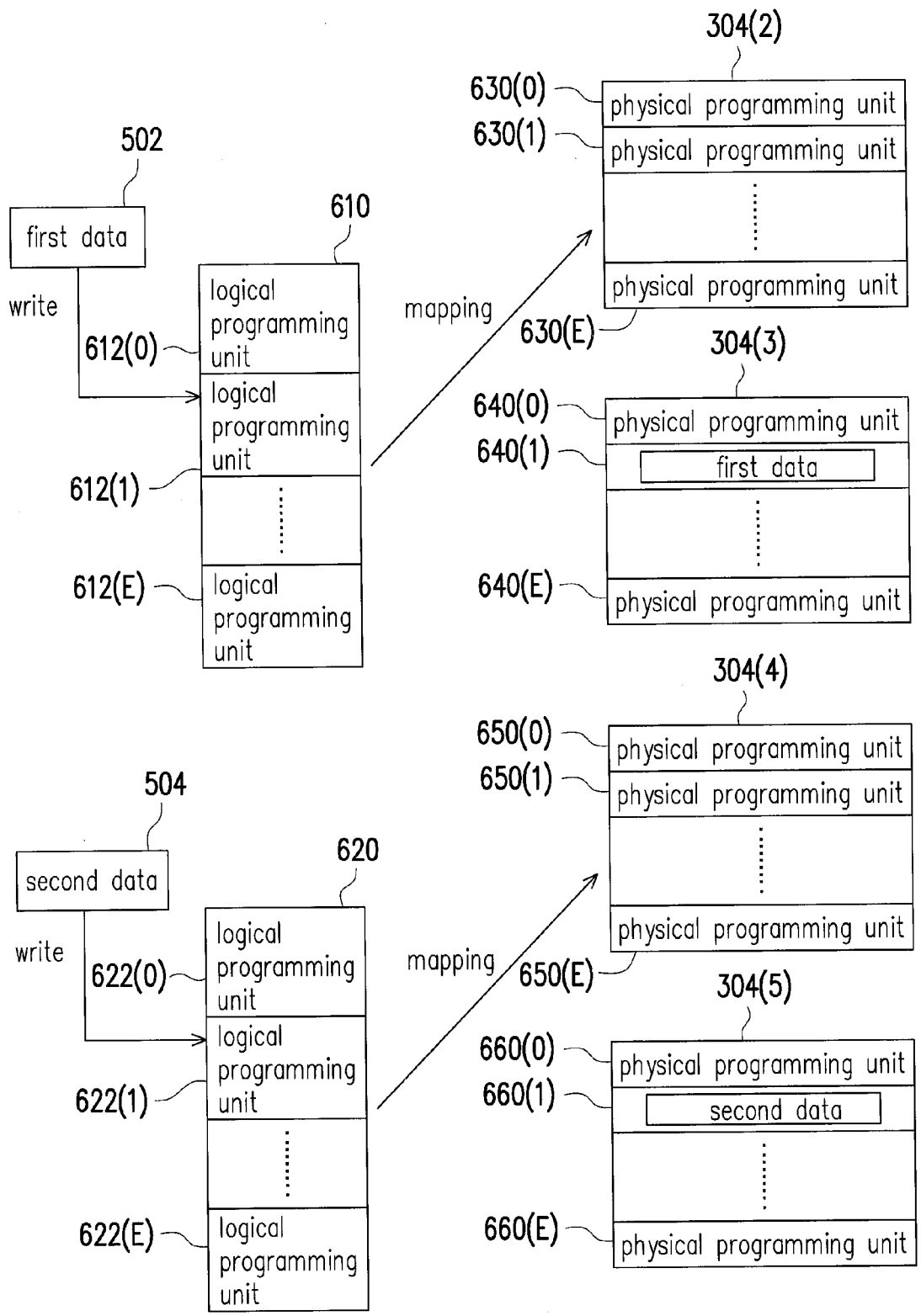
FIG. 6 is a schematic diagram illustrating a second writing procedure according to an exemplary embodiment of the invention.

FIG. 6 is a schematic diagram illustrating the second writing procedure according to an exemplary embodiment of the invention.

With reference to FIG. 6, here it is provided that logical erasing units 610 and 620 belong to the second region. The logical erasing unit 610 is originally mapped to the physical erasing unit 304(2). That is, the physical erasing unit 304(2) stores valid data belonging to the logical erasing unit 610. The logical erasing unit 620 is originally mapped to the physical erasing unit 304(4). That is, the physical erasing unit 304(4) stores valid data belonging to the logical erasing unit 620. The physical erasing unit 304(2) includes physical programming units 630(0)-630(E); the physical erasing unit 304(3) includes physical programming units 640(0)-640(E); the physical erasing unit 304(4) includes physical programming units 650(0)-650(E); and the physical erasing unit 304(5) includes physical programming units 660(0)-660(E). In the exemplary embodiment of FIG. 6, the host system 1000 issues a write command which instructs to write the first data 502 to the logical programming unit 612(1) in the logical erasing unit 610 (i.e. the first logical erasing unit). After receiving the write command, the memory management circuit 202 determines whether the logical erasing unit 610 belongs to the first region or the second region. After determining that the logical erasing unit 610 belongs to the second region, the memory management circuit 202 selects one physical erasing unit 304(3) (i.e. the second physical erasing unit) and writes the first data 502 to the physical erasing unit 304(3). In an exemplary embodiment, the memory management circuit 202 also copies partial valid data in the physical erasing unit 304(2) to the physical erasing unit 304(3). For example, the memory management circuit 202 first copies the valid data stored in the physical programming unit 630(0) to the physical programming unit 640(0) and then writes the first data 502 to the physical programming unit 640(1). In the exemplary embodiment of FIG. 6, the physical erasing unit 304(2) is also called a mother physical erasing unit and the physical erasing unit 304(3) is also called a child physical erasing unit.

It should be noted that, in the second writing procedure, all the valid data in the physical erasing units 304(2) and 304(3) belongs to the logical erasing unit 610. When the host system 1000 intends to write data to other logical erasing units, the data is not written to the physical erasing units 304(2) and 304(3). For example, the host system 1000 issues a write command which instructs to write the second data 504 to the logical programming unit 622(1) in the logical erasing unit 620. The memory management circuit 202 selects one physical erasing unit 304(5) and copies the valid data stored in the physical programming unit 650(0) to the physical programming unit 660(0) and then writes the second data 504 to the physical programming unit 660(1). All the valid data in the physical erasing units 304(4) and 304(5) belongs to the logical erasing unit 620.

With reference to FIG. 5D and FIG. 6, a difference between the first writing procedure and the second writing procedure is that: in the first writing procedure, valid data belonging to one logical erasing unit may be separately written to many physical erasing units and these physical erasing units may also store data of other logical erasing units; while in the second writing procedure, valid data belonging to one logical erasing unit is written to specific physical erasing units only (e.g. the mother physical erasing unit and the child physical erasing unit) and all the valid data in the specific physical erasing units belongs to the logical erasing unit.

In an exemplary embodiment, the memory management circuit 202 establishes a programming unit table for the first region. This programming unit table records mapping relationship between the logical programming units and the physical programming units. In addition, the memory management circuit 202 establishes an erasing unit table for the second region. This erasing unit table records mapping relationship between the logical erasing units and the physical erasing units. However, when being actually implemented, the memory management circuit 202 may establish the programming unit table only and not establish the erasing unit table; in that case, the mapping relationship between the logical erasing units and the physical erasing units is recorded in the programming unit table. The invention is not intended to limit whether the memory management circuit 202 establishes the programming unit table or the erasing unit table.

A write mode of the host system 1000 may be simply divided as sequential writing and non-sequential writing. The sequential writing means that the logical addresses that several write commands instruct to write are sequential; otherwise, it is non-sequential writing. If the write mode of the host system 1000 is sequential writing, a writing speed of the second writing procedure is greater than a writing speed of the first writing procedure. In contrast, if the write mode of the host system 1000 is non-sequential writing, the writing speed of the first writing procedure is greater than the writing speed of the second writing procedure.

Figure 7A:
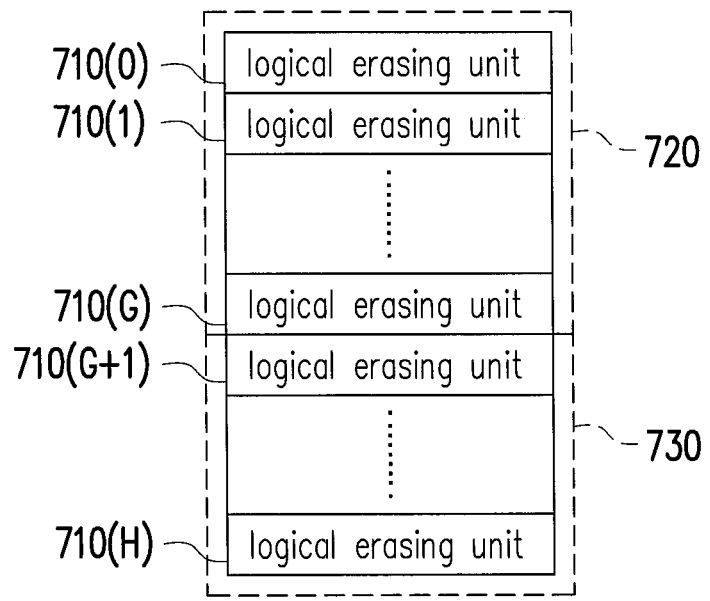
FIG. 7A and FIG. 7B are schematic diagrams illustrating grouping of a second region and a first region according to an exemplary embodiment of the invention.
Figure 7B:
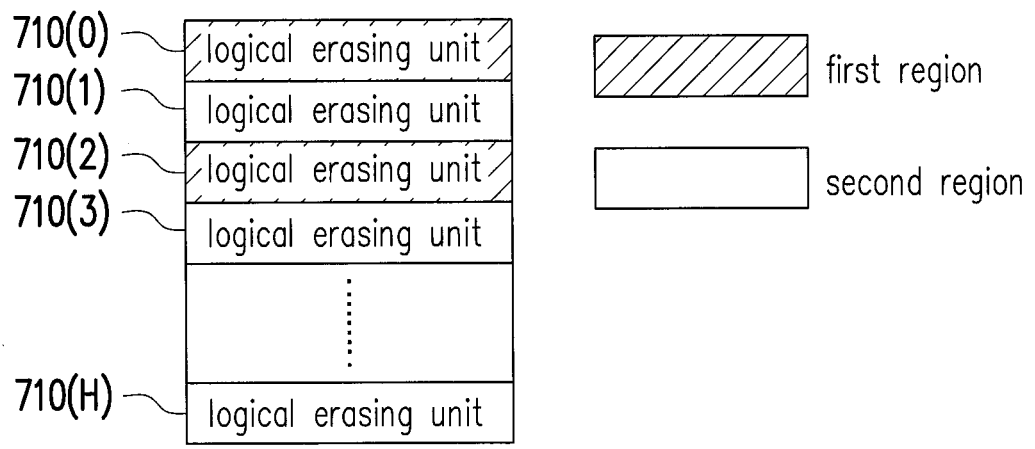

FIG. 7A and FIG. 7B are schematic diagrams illustrating grouping of a second region and a first region according to an exemplary embodiment of the invention.

With reference to FIG. 4 and FIG. 7A, the logical addresses 410(0)-410(D) constitute logical erasing units 710(0)-710(H). In an exemplary embodiment, the memory management circuit 202 determines a first ratio and a second ratio, wherein a sum of the first ratio and the second ratio is equal to 1. The memory management circuit 202 determines the numbers of the logical erasing units respectively in a first region 720 and a second region 730 according to the first ratio and the second ratio. More specifically, the first ratio of the logical erasing units 710(0)-710(H) belong to the first region 720 and the second ratio of the logical erasing units 710(0)-710(H) belong to the second region 730. In the exemplary embodiment of FIG. 7A, a sequential part, i.e. the logical erasing units 710(0)-710(G), of the logical erasing units 710(0)-710(H) belongs to the first region 720, and another sequential part, i.e. the logical erasing units 710(G+1)-710(H), of the logical erasing units 710(0)-710(H), belongs to the second region 730. The memory management circuit 202 may determine which sequential logical erasing units belong to the second region 730 according to a behavior of the host system 1000. For example, if the host system 1000 sequentially writes data in the random access memory of the host system 1000 to a later half of the logical erasing units 710(0)-710(H) when power down is about to occur, the memory management circuit 202 sets the later half of the logical erasing units 710(0)-710(H) as the second region. In addition, the memory management circuit 202 may determine the second ratio according to an amount of the data that the host system 1000 intends to write when power down occurs. However, in other exemplary embodiments, a first half of the logical erasing units 710(0)-710(H) may also be set as the second region 730. The invention is not limited to the above.

With reference to FIG. 7B, in the exemplary embodiment of FIG. 7B, the logical erasing units 710(0)-710(H) alternately belong to a first region and a second region. Here, "alternately" means that, after grouping n logical erasing units to the first region, m logical erasing units are grouped to the second region, wherein n and m are both positive integers. In FIG. 7B, n and m are both 1. However, the invention is not intended to limit the positive integers of m and n. For instance, if the positive integers n and m are both 2, it indicates that the logical erasing units 710(0) and 710(1) belong to the first region, and the logical erasing units 710(2) and 710(3) belong to the second region. Moreover, n/m is equal to a value of the first ratio divided by the second ratio.

In an exemplary embodiment, the memory management circuit 202 determines the first ratio and the second ratio according to a target writing speed. The target writing speed refers to a writing speed that the memory storage device 100 must reach when the write mode of the host system 1000 is sequential writing. Therefore, the larger the second ratio (the positive integer m is relatively larger), the more easily the target writing speed can be reached. More specifically, the first writing procedure has a random writing speed, and the second writing procedure has a sequential writing speed. The memory management circuit 202 sets the first ratio and the second ratio such that a sum of the first ratio multiplied by the random writing speed and the second ratio multiplied by the sequential writing speed is greater than or equal to the target writing speed, which may be represented by the following Equation (1).

$$V_1 \times R_1 + V_2 \times R_2 \geq V_{target} \quad (1)$$

$V_1$ represents the random writing speed; $R_1$ represents the first ratio; $V_2$ represents the sequential writing speed; $R_2$ represents the second ratio; and $V_{target}$ represents the target writing speed. It should be noted that the aforementioned Equation (1) is also applicable to the exemplary embodiment of FIG. 7A. The invention is not limited to the above.

Because the logical erasing units are grouped into the first region and the second region, when executing garbage collection, the memory management circuit 202 also executes different procedures correspondingly. To be more specific, when the number of available spare physical erasing units in the storage region 402 is lower than a threshold value, the memory management circuit 202 selects one physical erasing unit (i.e. a third physical erasing unit) to execute a garbage collection procedure. The selected physical erasing unit may be one physical erasing unit that stores the least valid data or one physical erasing unit that has been erased the least times. The invention is not intended to limit a mechanism for selecting the physical erasing unit. The memory management circuit 202 determines whether the valid data in the third physical erasing unit belongs to the first region or the second region. If the valid data belongs to the first region, the memory management circuit 202 executes a first garbage collection procedure. If the valid data belongs to the second region, the memory management circuit 202 executes a second garbage collection procedure. The first garbage collection procedure and the second garbage collection procedure are explained in detail below.

Referring to FIG. 5D again, if the selected physical erasing unit is the physical erasing unit 304(1) (which stores valid data belonging to the first region), the memory management circuit 202 copies all the valid data in the physical erasing unit 304(1) to another physical erasing unit (i.e. a fourth physical erasing unit). It should be noted that the fourth physical erasing unit may also store data belonging to other logical erasing units in addition to the valid data that is originally stored in the physical erasing unit 304(1) and belongs to the logical erasing units 510 and 520. In other words, the fourth physical erasing unit may store data belonging to different logical erasing units. Next, the memory management circuit 202 erases the physical erasing unit 304(1) to release one spare physical erasing unit. From another aspect, in the first garbage collection procedure, the memory management circuit 202 copies the valid data in multiple physical erasing units to the same physical erasing unit regardless of whether the valid data belongs to the same logical erasing unit or not.

Referring to FIG. 6, if the selected physical erasing unit is the physical erasing unit 304(2) (which stores valid data belonging to the second region), the memory management circuit 202 acquires the logical erasing unit 610, to which the physical erasing unit 304(2) is mapped, wherein the logical erasing unit is further mapped to the physical erasing unit 304(3). The memory management circuit 202 merges the valid data in the physical erasing units 304(2) and 304(3) and writes the merged valid data to one physical erasing unit (i.e. a fifth physical erasing unit), so that all the valid data in the fifth physical erasing unit belongs to the logical erasing unit 610, and maps the logical erasing unit 610 to the fifth physical erasing unit. It should be noted that the fifth physical erasing unit may be another physical erasing unit other than the physical erasing units 304(2) and 304(3), or may be the physical erasing unit 304(3). That is to say, the memory management circuit 202 may merge the valid data in the physical erasing unit 304(2) to the physical erasing unit 304(3) and then erases the physical erasing unit 304(2) to release one spare physical erasing unit. Alternatively, the memory management circuit 202 may merge the valid data in the physical erasing unit 304(2) to another physical erasing unit and then erases the physical erasing units 304(2) and 304(3). Moreover, if the selected physical erasing unit is the physical erasing unit 304(3), the memory management circuit 202 may merge the valid data in the physical erasing units 304(2) and 304(3) to one fifth physical erasing unit (not the physical erasing unit 304(3)), such that all the valid data in the fifth physical erasing unit belongs to the logical programming unit 610. Thereafter, the memory management circuit 202 erases the physical erasing units 304(2) and 304(3). From another aspect, in the second garbage collection procedure, the memory management circuit 202 merges the valid data in multiple physical erasing units to one physical erasing unit and the valid data belongs to the same logical erasing unit.

Figure 8:
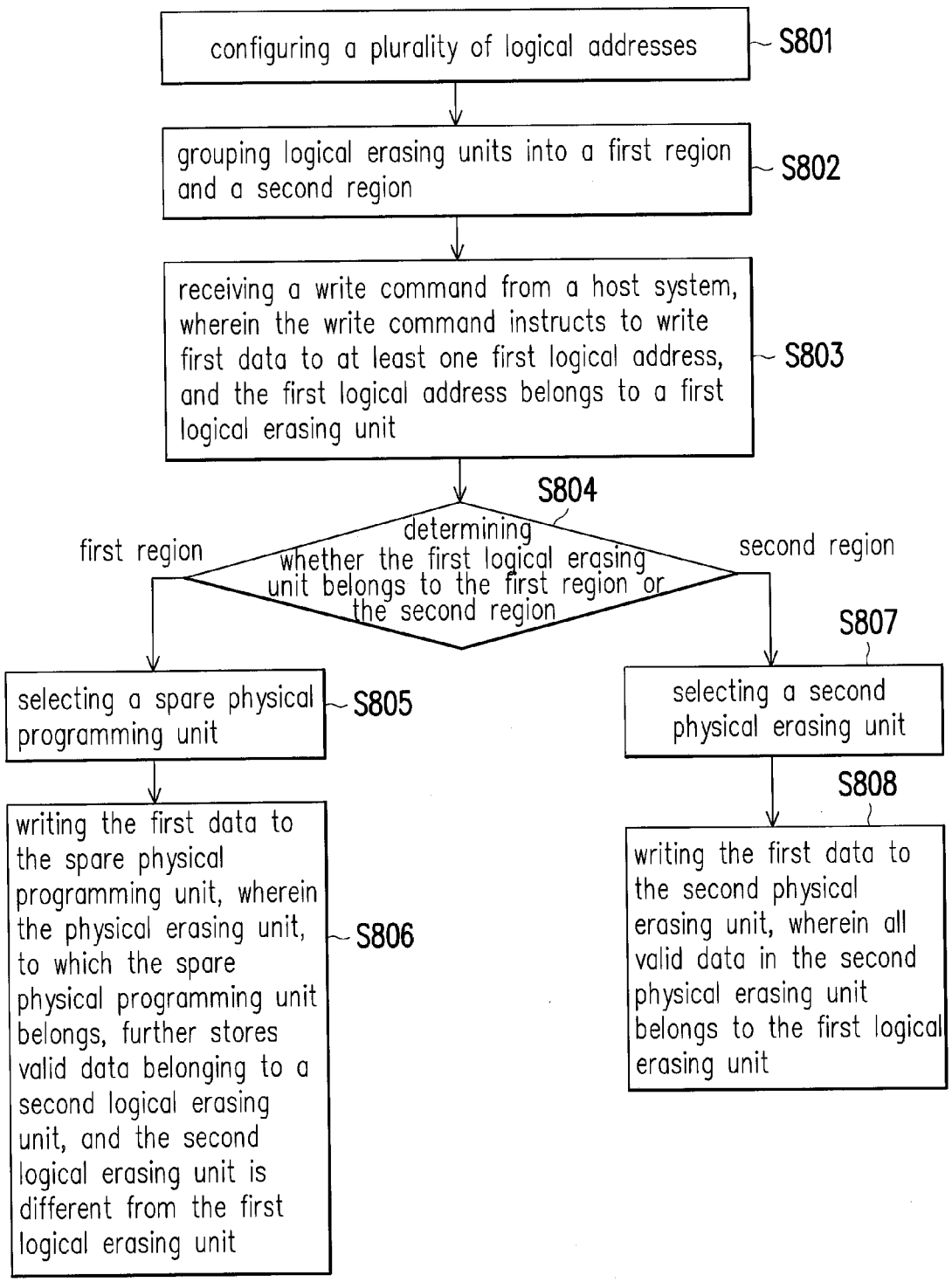
FIG. 8 is a flowchart illustrating a data writing method according to an exemplary embodiment of the invention.

FIG. 8 is a flowchart illustrating a data writing method according to an exemplary embodiment of the invention.

With reference to FIG. 8, in Step S801, a plurality of logical addresses are configured, wherein the logical addresses constitute a plurality of logical programming units, and the logical programming units constitute a plurality of logical erasing units. In Step S802, the logical erasing units are grouped into a first region and a second region. In Step S803, a write command is received from a host system, and the write command instructs to write first data to at least one first logical address, wherein the first logical address belongs to a first logical erasing unit. In Step S804, whether the first logical erasing unit belongs to the first region or the second region is determined.

If the first logical erasing unit belongs to the first region, in Step S805, a spare physical programming unit is selected. In Step S806, the first data is written to the spare physical programming unit, wherein the physical erasing unit, to which the spare physical programming unit belongs, further stores data belonging to a second logical erasing unit, and the second logical erasing unit is different from the first logical erasing unit.

If the first logical erasing unit belongs to the second region, in Step S807, a second physical erasing unit is selected. In Step S808, the first data is written to the second physical erasing unit, wherein all valid data in the second physical erasing unit belongs to the first logical erasing unit.

Step S805 and Step S806 are also called a first writing procedure. Step S807 and Step S808 are also called a second writing procedure. Each step of FIG. 8 has been specified as above and thus is not repeated hereinafter. It should be understood that each step of FIG. 8 may be implemented as a plurality of program codes or circuits, and the invention is not limited to the above. In addition, the method of FIG. 8 may be used in combination with the above-described embodiments or be used solely. Nevertheless, the invention is not limited thereto.

To sum up, the data writing method, memory controlling circuit unit, and memory storage device disclosed in the exemplary embodiments of the invention group the first region and the second region according to the target writing speed, such that the speed of sequential writing is higher than the target writing speed in any situation. In addition, the logical space provided to the host system is not reduced.

The previously described exemplary embodiments of the present invention have the advantages aforementioned, wherein the advantages aforementioned not required in all versions of the invention.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A data writing method, for a rewritable non-volatile memory module which comprises a plurality of physical erasing units each comprising a plurality of physical programming units, the data writing method comprising:
configuring a plurality of logical addresses, wherein the logical addresses constitute a plurality of logical programming units and the logical programming units constitute a plurality of logical erasing units;
grouping the logical erasing units into a first region and a second region;
receiving a write command from a host system, wherein the write command instructs to write first data to at least one first logical address of the logical addresses and the at least one first logical address belongs to a first logical erasing unit of the logical erasing units;
determining whether the first logical erasing unit belongs to the first region or the second region;
executing a first writing procedure if the first logical erasing unit belongs to the first region, wherein the first writing procedure comprises:
selecting a spare physical programming unit from the physical programming units; and
writing the first data to the spare physical programming unit, wherein the spare physical programming unit belongs to a first physical erasing unit of the physical erasing units and the first physical erasing unit further stores data belonging to a second logical erasing unit of the logical erasing units, and the second logical erasing unit is different from the first logical erasing unit,
executing a second writing procedure if the first logical erasing unit belongs to the second region, wherein the second writing procedure comprises:
selecting a second physical erasing unit from the physical erasing units; and
writing the first data to the second physical erasing unit, wherein all valid data in the second physical erasing unit belongs to the first logical erasing unit.

2. The data writing method according to claim 1, further comprising:
determining a first ratio and a second ratio according to a target writing speed, wherein the first ratio of the logical erasing units belong to the first region and the second ratio of the logical erasing units belong to the second region.

3. The data writing method according to claim 2, wherein the first writing procedure has a random writing speed and the second writing procedure has a sequential writing speed, and the step of determining the first ratio and the second ratio comprises:
setting the first ratio and the second ratio such that a sum of the first ratio multiplied by the random writing speed and the second ratio multiplied by the sequential writing speed is greater than or equal to the target writing speed.

4. The data writing method according to claim 1, wherein the logical erasing units alternately belong to the first region and the second region.

5. The data writing method according to claim 1, wherein a sequential part of the logical erasing units belongs to the first region and another sequential part of the logical erasing units belongs to the second region.

6. The data writing method according to claim 1, further comprising:
selecting a third physical erasing unit from the physical erasing units;
determining whether valid data in the third physical erasing unit belongs to the first region or the second region;
executing a first garbage collection procedure if the valid data in the third physical erasing unit belongs to the first region, wherein the first garbage collection procedure comprises:
copying the valid data in the third physical erasing unit to a fourth physical erasing unit of the physical erasing units, wherein the fourth physical erasing unit stores data belonging to different logical erasing units; and
erasing the third physical erasing unit.

7. The data writing method according to claim 6, further comprising:
executing a second garbage collection procedure if the valid data in the third physical erasing unit belongs to the second region, wherein the second garbage collection procedure comprises:
acquiring a third logical erasing unit, to which the third physical erasing unit is mapped, from the logical erasing units, wherein the third logical erasing unit is further mapped to a fourth physical erasing unit of the physical erasing units, and all valid data in the fourth physical erasing unit belongs to the third logical erasing unit;
merging the valid data in the third physical erasing unit and the valid data in the fourth physical erasing unit, and writing the merged valid data into a fifth physical erasing unit of the physical erasing units, wherein all valid data in the fifth physical erasing unit belongs to the third logical erasing unit; and
erasing the third physical erasing unit.

8. A memory storage device, comprising:
a connection interface unit coupled to a host system;
a rewritable non-volatile memory module comprising a plurality of physical erasing units each comprising a plurality of physical programming units; and
a memory controlling circuit unit coupled to the connection interface unit and the rewritable non-volatile memory module and configured to configure a plurality of logical addresses, wherein the logical addresses constitute a plurality of logical programming units and the logical programming units constitute a plurality of logical erasing units,
wherein the memory controlling circuit unit is configured to group the logical erasing units to a first region and a second region and receive a write command from the host system, wherein the write command instructs to write first data to at least one first logical address of the logical addresses and the at least one first logical address belongs to a first logical erasing unit of the logical erasing units, wherein the memory controlling circuit unit is configured to determine whether the first logical erasing unit belongs to the first region or the second region, if the first logical erasing unit belongs to the first region, the memory controlling circuit unit is configured to select a spare physical programming unit from the physical programming units and write the first data to the spare physical programming unit, wherein the spare physical programming unit belongs to a first physical erasing unit of the physical erasing units and the first physical erasing unit further stores data belonging to a second logical erasing unit of the logical erasing units, and the second logical erasing unit is different from the first logical erasing unit, and if the first logical erasing unit belongs to the second region, the memory controlling circuit unit is configured to select a second physical erasing unit from the physical erasing units and write the first data to the second physical erasing unit, wherein all valid data in the second physical erasing unit belongs to the first logical erasing unit.

9. The memory storage device according to claim 8, wherein the memory controlling circuit unit is further configured to determine a first ratio and a second ratio according to a target writing speed, wherein the first ratio t of the logical erasing units belong to the first region and the second ratio of the logical erasing units belong to the second region.

10. The memory storage device according to claim 9, wherein the first writing procedure has a random writing speed and the second writing procedure has a sequential writing speed, and an operation of the memory controlling circuit unit to determine the first ratio and the second ratio comprises:

the memory controlling circuit unit sets the first ratio and the second ratio such that a sum of the first ratio multiplied by the random writing speed and the second ratio multiplied by the sequential writing speed is greater than or equal to the target writing speed.

11. The memory storage device according to claim 8, wherein the logical erasing units alternately belong to the first region and the second region.

12. The memory storage device according to claim 8, wherein a sequential part of the logical erasing units belongs to the first region and another sequential part of the logical erasing units belongs to the second region.

13. The memory storage device according to claim 8, wherein the memory controlling circuit unit is further configured to select a third physical erasing unit from the physical erasing units and determine whether valid data in the third physical erasing unit belongs to the first region or the second region, the memory controlling circuit unit is configured to execute a first garbage collection procedure if the valid data in the third physical erasing unit belongs to the first region, wherein the first garbage collection procedure comprises:

copying the valid data in the third physical erasing unit to a fourth physical erasing unit of the physical erasing units, wherein the fourth physical erasing unit stores data belonging to different logical erasing units; and erasing the third physical erasing unit.

14. The memory storage device according to claim 13, wherein:

the memory controlling circuit unit is configured to execute a second garbage collection procedure if the valid data in the third physical erasing unit belongs to the second region, wherein the second garbage collection procedure comprises:

acquiring a third logical erasing unit, to which the third physical erasing unit is mapped, from the logical erasing units, wherein the third logical erasing unit is further mapped to a fourth physical erasing unit of the physical erasing units, and all valid data in the fourth physical erasing unit belongs to the third logical erasing unit;

integrating the valid data in the third physical erasing unit and the valid data in the fourth physical erasing unit, and writing the merged valid data into a fifth physical erasing unit of the physical erasing units, wherein all valid data in the fifth physical erasing unit belongs to the third logical erasing unit; and erasing the third physical erasing unit.

15. A memory controlling circuit unit, for controlling a rewritable non-volatile memory module which comprises a plurality of physical erasing units each comprising a plurality of physical programming units, the memory controlling circuit unit comprising:

a host interface coupled to a host system;

a memory interface coupled to the rewritable non-volatile memory module; and a memory management circuit coupled to the host interface and the memory interface and configured to configure a plurality of logical addresses, wherein the logical addresses constitute a plurality of logical programming units and the logical programming units constitute a plurality of logical erasing units, wherein the memory management circuit is configured to group the logical erasing units to a first region and a second region and receive a write command from the host system, wherein the write command instructs to write first data to at least one first logical address of the logical addresses and the at least one first logical address belongs to a first logical erasing unit of the logical erasing units, wherein the memory management circuit is configured to determine whether the first logical erasing unit belongs to the first region or the second region, if the first logical erasing unit belongs to the first region, the memory management circuit is configured to select a spare physical programming unit from the physical programming units and write the first data to the spare physical programming unit, wherein the spare physical programming unit belongs to a first physical erasing unit of the physical erasing units and the first physical erasing unit further stores data belonging to a second logical erasing unit of the logical erasing units, and the second logical erasing unit is different from the first logical erasing unit, and if the first logical erasing unit belongs to the second region, the memory management circuit is configured to select a second physical erasing unit from the physical erasing units and write the first data to the second physical erasing unit, wherein all valid data in the second physical erasing unit belongs to the first logical erasing unit.

16. The memory controlling circuit unit according to claim 15, wherein the memory management circuit is further configured to determine a first ratio and a second ratio according to a target writing speed, wherein the first ratio of the logical erasing units belong to the first region and the second ratio of the logical erasing units belong to the second region.

17. The memory controlling circuit unit according to claim 16, wherein the first writing procedure has a random writing speed and the second writing procedure has a sequential writing speed, and an operation of the memory management circuit to determine the first ratio and the second ratio comprises:

the memory management circuit sets the first ratio and the second ratio such that a sum of the first ratio multiplied by the random writing speed and the second ratio multiplied by the sequential writing speed is greater than or equal to the target writing speed.

18. The memory controlling circuit unit according to claim 15, wherein the logical erasing units alternately belong to the first region and the second region.

19. The memory controlling circuit unit according to claim 15, wherein a sequential part of the logical erasing units belongs to the first region and another sequential part of the logical erasing units belongs to the second region.

20. The memory controlling circuit unit according to claim 15, wherein the memory management circuit is further configured to select a third physical erasing unit from the physical erasing units and determine whether valid data in the third physical erasing unit belongs to the first region or the second region, the memory management circuit is configured to execute a first garbage collection procedure if the valid data in the third physical erasing unit belongs to the first region, wherein the first garbage collection procedure comprises:

copying the valid data in the third physical erasing unit to a fourth physical erasing unit of the physical erasing units, wherein the fourth physical erasing unit stores data belonging to different logical erasing units; and erasing the third physical erasing unit.

21. The memory controlling circuit unit according to claim 20, wherein:

the memory management circuit is configured to execute a second garbage collection procedure if the valid data in the third physical erasing unit belongs to the second region, wherein the second garbage collection procedure comprises:

acquiring a third logical erasing unit, to which the third physical erasing unit is mapped, from the logical erasing units, wherein the third logical erasing unit is further mapped to a fourth physical erasing unit of the physical erasing units, and all valid data in the fourth physical erasing unit belongs to the third logical erasing unit;

merging the valid data in the third physical erasing unit and the valid data in the fourth physical erasing unit and writing the merged valid data into a fifth physical erasing unit of the physical erasing units, wherein all valid data in the fifth physical erasing unit belongs to the third logical erasing unit; and erasing the third physical erasing unit.

* * * * *